US006166663A

United States Patent [19]
Chen et al.

[11] Patent Number: 6,166,663
[45] Date of Patent: Dec. 26, 2000

[54] ARCHITECTURE FOR INVERSE QUANTIZATION AND MULTICHANNEL PROCESSING IN MPEG-II AUDIO DECODING

[75] Inventors: Liang-Gee Chen; Tsung-Han Tsai, both of Taipei, Taiwan

[73] Assignee: National Science Council, Taipei, Taiwan

[21] Appl. No.: 09/354,797

[22] Filed: Jul. 16, 1999

[51] Int. Cl.[7] .............................. H03M 7/00; G10L 21/00
[52] U.S. Cl. .............................. 341/50; 341/200; 704/500
[58] Field of Search ..................... 341/50, 200; 704/500, 704/230

[56] References Cited

U.S. PATENT DOCUMENTS

| | | | |
|---|---|---|---|
| 5,185,800 | 2/1993 | Mahieux | 704/500 |
| 5,625,743 | 4/1997 | Fiocca | 704/205 |
| 5,649,053 | 7/1997 | Kim | 704/229 |

*Primary Examiner*—Michael Tokar
*Assistant Examiner*—Daniel D. Chang
*Attorney, Agent, or Firm*—Bacon & Thomas, PLLC

[57] ABSTRACT

A hardware structure for inverse quantization and multichannel processing in MPEG-2 audio decoding is provided, which includes 5 groups of first-in-first-out (abbreviated as FIFO) registers, each group of which has 3 FIFO registers and are connected in series; a multiplier capable for receiving an internal data processing feedback from the last FIFO group of FIFO registers; a single register; a first adder/subtractor capable for receiving a feedback from the first group of FIFO registers and its output being fed to the first group of FIFO registers; a second adder/subtractor capable for receiving a feedback from a second group of FIFO registers. The second group of FIFO registers stores an output from the second adder/subtractor or an output from the first group of FIFO registers; a third group of FIFO registers stores an output from the single register or an output from the second group of FIFO registers; a fourth group of FIFO registers stores an output from the third group of FIFO registers; and so on. The single register output the calculated value of the multiplier as an output of the structure or to at least one of the first second adder/subtractor, second adder/subtractor and the third group of FIFO registers.

4 Claims, 6 Drawing Sheets

ARCHITECTURE FOR INVERSE QUANTIZATION AND MULTICHANNEL PROCESSING IN MPEG-II AUDIO DECODING

FIELD OF THE INVENTION

The present invention is related to an architecture for inverse quantization and multichannel processing in MPEG-II audio decoding.

BACKGROUND OF THE INVENTION

The MPEG audio coding standard is the international standard for the compression of digital audio signals. It can be applied both for audiovisual and audio-only applications to significantly reduce the requirements of transmission bandwidth and data storage with low distortion. The second phase of MPEG, labeled as MPEG-2, aims to support all the normative feature listed in MPEG-1 audio and provide extension capabilities of multi-channel and multilingual audio on an extension of standard to lower sampling frequencies and lower bit rates. No matter what is MPEG-1 or MPEG-2 standard, the MPEG audio compression standard defines threes layers of compression, named as Layer I, II, and III. Each successive layer offers better compression performance, but at a higher complexity and computation cost. Layer I and II are basically similar and based on subband coding. The difference between them mainly lies in formatting side information and a finer quantization is provided in Layer II. Layer III adopts more complex schemes such as hybrid filterbank, Huffman coding and non-linear quantization. From the viewpoint of hardware complexity and achieved quality, Layer II might be a reasonable compromise for general usage. In the official ISO/MPEG subject tests, Layer II coding shows an excellent performance of CD quality at a 128 Kbps per monophonic channel.

The MPEG-2 audio coding standard is an extension of the MPEG-1. With backward compatibility, it is possible to produce a multi-channel audio at any time without making the two-channel MPEG-1 obsolete. In MPEG-2 audio coding, five audio channels L (left), R (right), C (central), LS (left surround), RS (right surround) are mapped to five transmission channels T0, T1, T2, T3, T4. The T0 and T1 channels are compatible with the left and right basic transmission channels of MPEG-1 audio, and the T2 to T4 channels are extended transmission channels. Consequently, in MPEG-2 audio decoding a multichannel decoder is required to reconstruct multichannel audio signals.

The MPEG-2 audio decoding related to inverse quantization and multichannel processing is described in FIG. 1. The coded data is subjected to frame unpacking while decoding of bit allocation and scale factor. The quantized data is recovered through an operation of inverse quantization, and reconstructed data can be generated through multichannel processing followed by synthesizing 32 subband data in a subband synthesis filter.

The elementary concept behind MPEG is based on the multirate subband-based coding techniques. Basically, the most computational load depends highly on the realization of the synthesis subband in the decoder, and can be reduced using the regular fast algorithm, such as inverse-modified discrete cosine transform (IMDCT) and fast Fourier transform (FET) with data shifting and rearrangement. As for the other important computational parts of the decoding, inverse quantization (IQ) and multichannel processing (MC) are seldom mentioned and seem to be unsuitable when applying a fast algorithm based on the characteristics of complex control and irregular data flow.

Referring to the architecture design, different aspects of the architecture must be utilized in the MPEG-2 audio decoder. These designs are basically applied either as general purpose DSP-based techniques such as stand-alone chip sets, or proposed as architecture dedicated to the MPEG-2 audio bitstream. Whether the architecture is DSP-based or is dedicated architecture, most processors implement the MPEG-2 decoding by programming. However, these processors suffer from considerable overheads of computation and control. Moreover, some papers have only focused on the synthesis subband with a dedicated cost-effective architecture. In that case, they must perform the IQ and MC in the host platform, such as PC. These designs also increase the complexity in the interface and communication between the dedicated chip sets and the host.

SUMMARY OF THE INVENTION

A primary objective of the present invention is to provide an architecture of inverse quantization ((abbreviated hereinafter as IQ) and multichannel processing ((abbreviated hereinafter as MC) which support the Layer I and II for the MPEG-2 audio decoding, and which has the advantages of simplicity, so that it can easily and efficiently cooperate with other dedicated synthesis subband chips to form a complete MPEG-2 decoder either when the architecture is realized as a single chip or as a processing core.

Another objective of the present invention is to provide an architecture of IQ and MC which support the Layer I and II for the MPEG-2 audio decoding processor core by using the dedicated hardware approach (ASIC), and thus a more efficient VLSI solution can be provided with no program ROM, whereby advantages of low cost, reduced chip area and low complexity can be achieved.

Another further objective is to provide a pipelined architecture for IQ and MC in MPEG-II audio decoding.

Still another objective is to provide an architecture for IQ and MC in MPEG-II audio decoding, wherein various dematrixing modes can be completed during a constant number of clocks, so that a register design of a distributed type can be adopted to efficiently and flexibly store multichannel data, and thus a fixed throughput is generated with this architecture.

In order to accomplished the aforesaid objectives an architecture for IQ and MC in MPEG-2 audio decoding constructed according to the present invention comprises:

M groups of first-in-first-out (abbreviated hereinafter as FIFO) registers, wherein M is an integer equal to or greater than 5, each group of which has a plurality of FIFO registers and has the same number of FIFO registers, wherein all the FIFO registers are connected in series, so that samples fed to a first FIFO register thereof in the course of clock can be stored one-by-one and shifted in the FIFO registers according to a first-in-first-out rule;

a multiplier having two input terminals, one of which is adapted to receive a first factor from a first factor table, and another of which is capable for receiving an internal data processing feedback from a last FIFO register of said M groups of FIFO registers and is adapted to receive an external audio sample, a single register storing a calculated value of said multiplier;

a first adder/subtractor having two input terminals and one output terminal, wherein one of said two input terminals is connected to said single register for receiving said calculated value stored therein, another one of said two input terminals is for receiving a feedback from a last FIFO register of a first group of FIFO registers of said M groups of FIFO registers and a second factor of a second factor table, and said output terminal thereof is connected to a first FIFO register of the first group of FIFO registers, so that an output of said first adder/subtractor is fed and stored in the first FIFO register of the first group of FIFO registers;

a second adder/subtractor having two input terminals and one output terminal, wherein one of said two input terminals is connected to said single register for receiving the calculated value stored therein, and another one of said two input terminals is for receiving a feedback from a last FIFO register of a second group of FIFO registers of said M groups of FIFO registers; wherein a first FIFO register of said second group of FIFO registers stores an output from said output terminal of said second adder/subtractor or an output from said last FIFO register of said first group of FIFO registers; a first FIFO register of a third group of FIFO registers of said M groups of FIFO registers stores the calculated value stored in said single register or an output from said last FIFO register of said second group of FIFO registers; a first FIFO register of a fourth group of FIFO registers of said M groups of FIFO registers stores an output from a last FIFO register of said third group of FIFO registers, and so on, until an output from the last FIFO register of said M groups of FIFO registers is returned to said multiplier as said internal data processing feedback; and said single register stores said calculated value of said multiplier at a clock number n, wherein n is an integer greater than 0, and output said calculated value of said multiplier to an outside buffer as an output of said structure or to at least one of said first second adder/subtractor, second adder/subtractor and said first FIFO register of said third group of FIFO registers at a clock number of n+1.

Preferably, M is set to equal to 5 for five audio channels in MPEG-2 audio decoding. More preferably, each group of said M groups of FIFO registers has three FIFO registers for use in Layer II audio decoding of MPEG-2.

Preferably, the architecture of the present invention further comprises means for generating control signals, which has a counter for generating clock numbers in response to said inverse quantization and multichannel processing in MPEG-2 audio decoding. Said means is adapted to receive a factor of transmission mode. Said control signals are generated by using the clock numbers and said factor of transmission mode, and are fed to said multiplier, said first and second adder/subtractors, said single register, and said M groups of FIFO registers, so that said multiplier, said first and second adder/subtractors, said single register, and said M groups of FIFO registers can perform predetermined tasks according to said clock numbers.

DETAILED DESCRIPTION OF THE INVENTION

This invention has described a novel aspect of architecture for the MPEG-2 audio decoding processor core, stressing mainly the IQ (inverse quantization) and MC (multichannel processing). With the direct hardware implementation approach, no program ROM is needed in order to reduce the overheads of the control and chip area. Additionally, any type of dematrixing modes can be implemented efficiently with a flexible data allocation. Based on the two-stage pipelined and distributed registers architecture, the high efficiency requirement with a fixed throughput is achieved.

Figure 1:
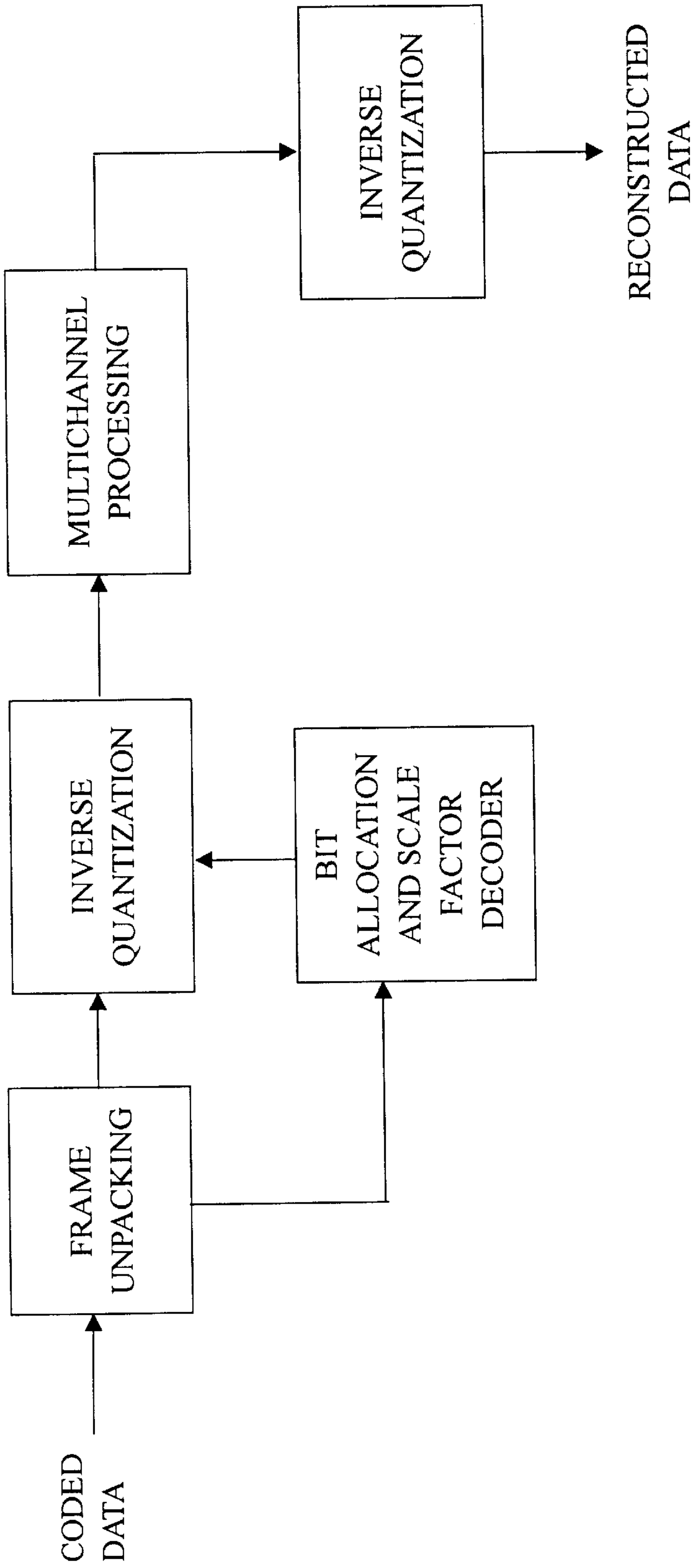
FIG. 1 shows a partial MPEG-2 audio decoding flow chart.
Figure 2:
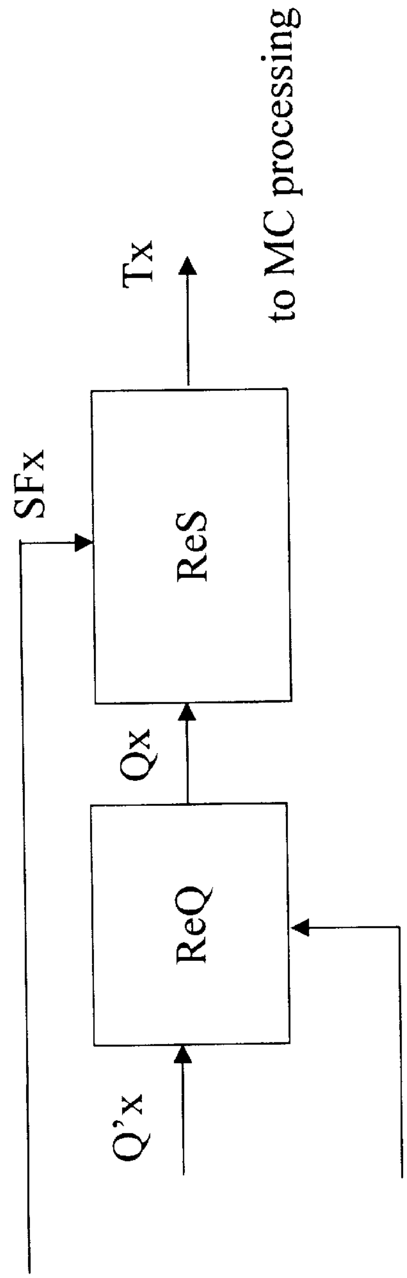
FIG. 2 shows a detailed scheme of the inverse quantization (IQ) in FIG. 1.
Figure 3:
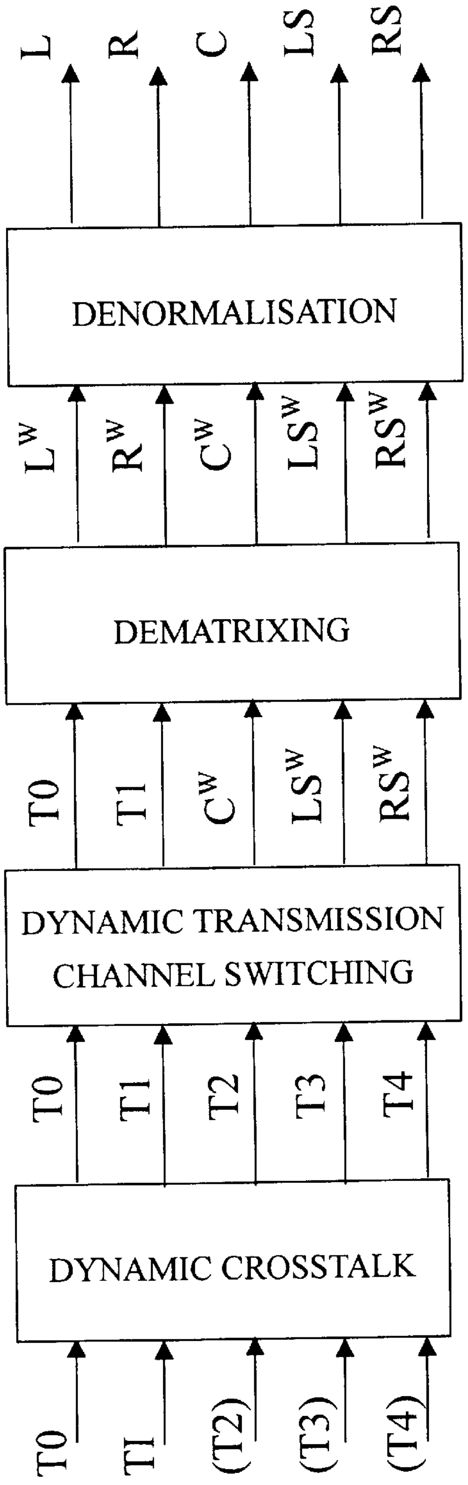
FIG. 3 shows a detailed scheme of the multichannel processing (MC) in FIG. 1.

FIG. 2 shows a further decomposition of IQ (inverse quantization) of samples in Layer II application. As shown in FIG. 2, IQ involves two major processing portions of requantization (ReQ) and Rescalization (ReS), wherein Qx is a requantized sample, Q'x is an unpacking sample, SFx is a rescaling factor. The MC (multichannel processing) as shown in FIG. 3 can be decomposed into four portions including dynamic crosstalk (DC), dynamic transmission channel switching (DTCS), dematrixing (DeM) and denormalisation (DeN), wherein five audio channels L (left), R (right), C (central), LS (left surround), RS (right surround) are mapped to five transmission channels T0, T1, T2, T3, T4; and the superscript W means being weighted.

The following Table 1 lists required arithmetic operations in IQ and MC modules, wherein C and are bit-allocated factors, and N is the combined factors of weighting and denormalisation factors; and the subscript x indicates the channel. These modules have been further divided into some functions. For the sake of brevity, $A_x$ is one of the signals from any of the five audio channels, and $A_x^x$ is one of the weight signals from any of the five weight audio channels. $M_i$ is one of the signals referred to as the main signal of L, R. Firstly, it can be seen that the arithmetic operations in IQ and MC are multiplication and addition. In the analysis, the operations of multiplication and addition can be classified and grouped in each associated cycle. Three cycles, Cycle I} to Cycle III, are performed. By modifying the arithmetic order of Cycle I}:

$$Q_x = C \cdot Q'_x + C \cdot D = C \cdot (Q'_x + D) \quad (1)$$

(1) can be implemented by a multiplication-first-addition-last operation. Based on this reordering modification, the operation in Cycle I will be consistent with other cycles and implemented using a simpler controller. Secondly, to overcome the irregular data flow and complex control in multichannel processing, distributed-registers architecture will be proposed and illustrated in FIG. 4.

TABLE 1

| Module | Function | Arithmetic Calculations | Classification |
|---|---|---|---|
| IQ | ReQ | $Q_x = C \cdot (Q'_x + D)$ | Cycle I |
| | ReS | $T_x = SF_x \cdot Q_x$ | Cycle II |
| MC | DC | $SF_y \leftarrow SF_x$ | Cycle II |
| | DTCS | $A_x^w \leftarrow T_x$ | Cycle II |
| | DeM | $A_x^w = M_i - A_y^W - A_z^w$ | Cycle II |
| | DeN | $A_x = A_x^w \cdot N$ | Cycle III |

Figure 4:
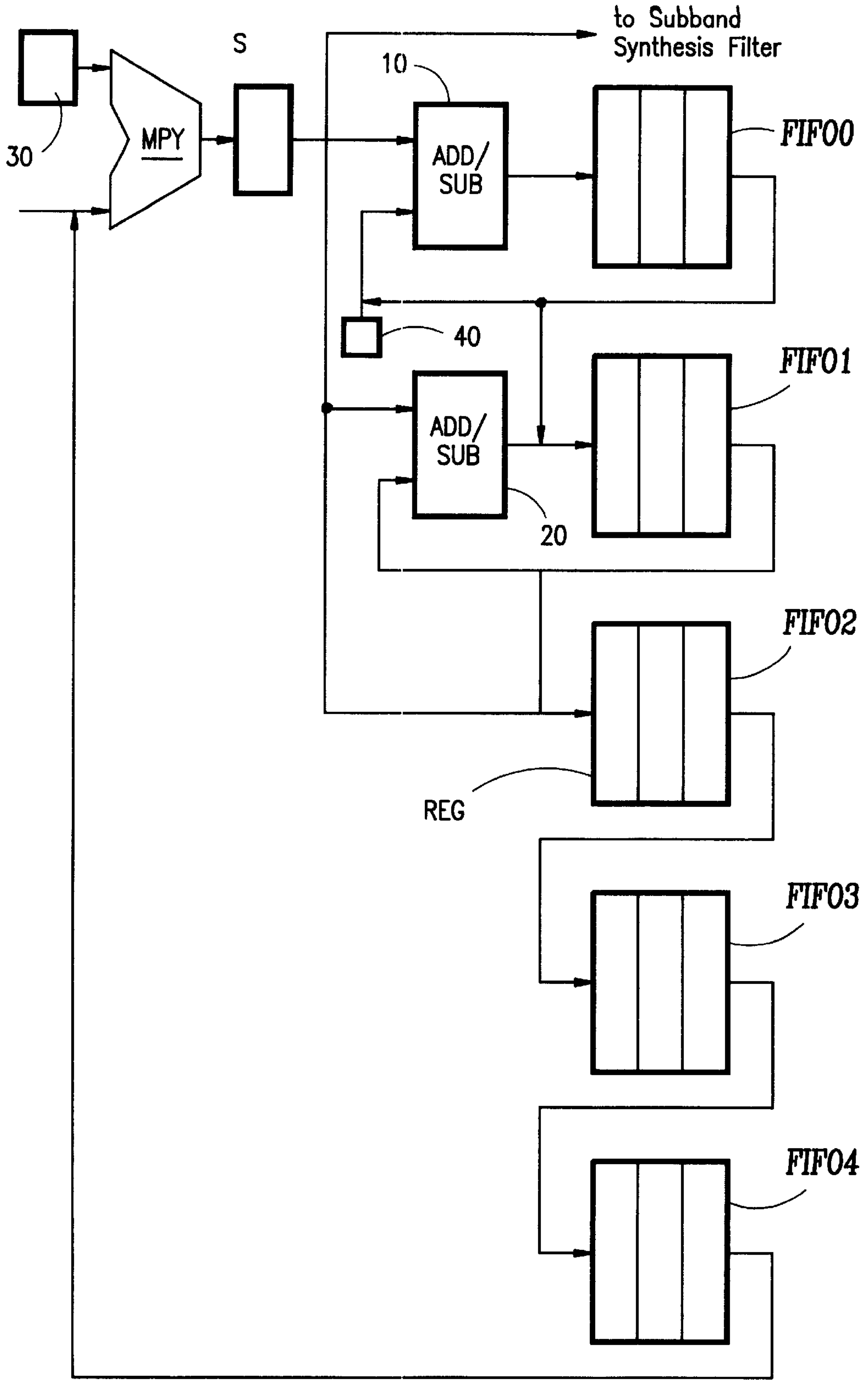
FIG. 4 is a block diagram showing an architecture for inverse quantization and multichannel processing in MPEG-II audio decoding constructed according to one of the preferred embodiments of the present invention.

As shown in FIG. 4, the architecture for IQ and MC in MPEG-2 audio decoding comprises a multiplier MPY, a single register S, two adder/subtractors 10, 20 (ADD/SUB), and a plurality of groups of first-in-first-out (FIFO) shift registers connected in series. The multiplier MPY and the first ADD/SUB 10 have an input terminal connected to a first factor table memory 30 and a second factor table memory 40 respectively, so that the factors in the arithmetic calculations in Table 1 can be input thereto. Three FIFO registers per one channel are supported for Layer-2 decoding applications. Each three FIFO registers are grouped as FIFO0 to FIFO4 which maps to five audio channels. The relationship between the audio channel data and the groups of FIFO registers is shown in Table 2, wherein a factor of transmission mode, tc_allocation, represents the distribution of audio channel data in the five groups of FIFO registers. The outputs of the first group (FIFO0) and the second group (FIFO1) of FIFO registers can be returned to the ADD/SUB 10 and 20 respectively as their internal data processing feedback. The output from the last group FIFO registers (FIFO4) is returned to said multiplier MPY as an internal data processing feedback of the whole architecture. With the help from the single register S and the five groups of FIFO registers, the multiplier MPY and two ADD/SUB 10, 20 are used as a two-stage piplined structure to achieve high performance.

TABLE 2

| tc_allocation | FIFO0 | FIFO1 | FIFO2 | FIFO3 | FIFO4 |
|---|---|---|---|---|---|
| 0 | L | R | C | LS | RS |
| 1 | R | C | L | LS | RS |
| 2 | L | C | R | LS | RS |
| 3 | R | LS | C | L | RS |
| 4 | L | RS | C | LS | R |
| 5 | LS | RS | C | L | R |
| 6 | C | LS | R | L | RS |
| 7 | C | RS | L | LS | R |

Figure 5:
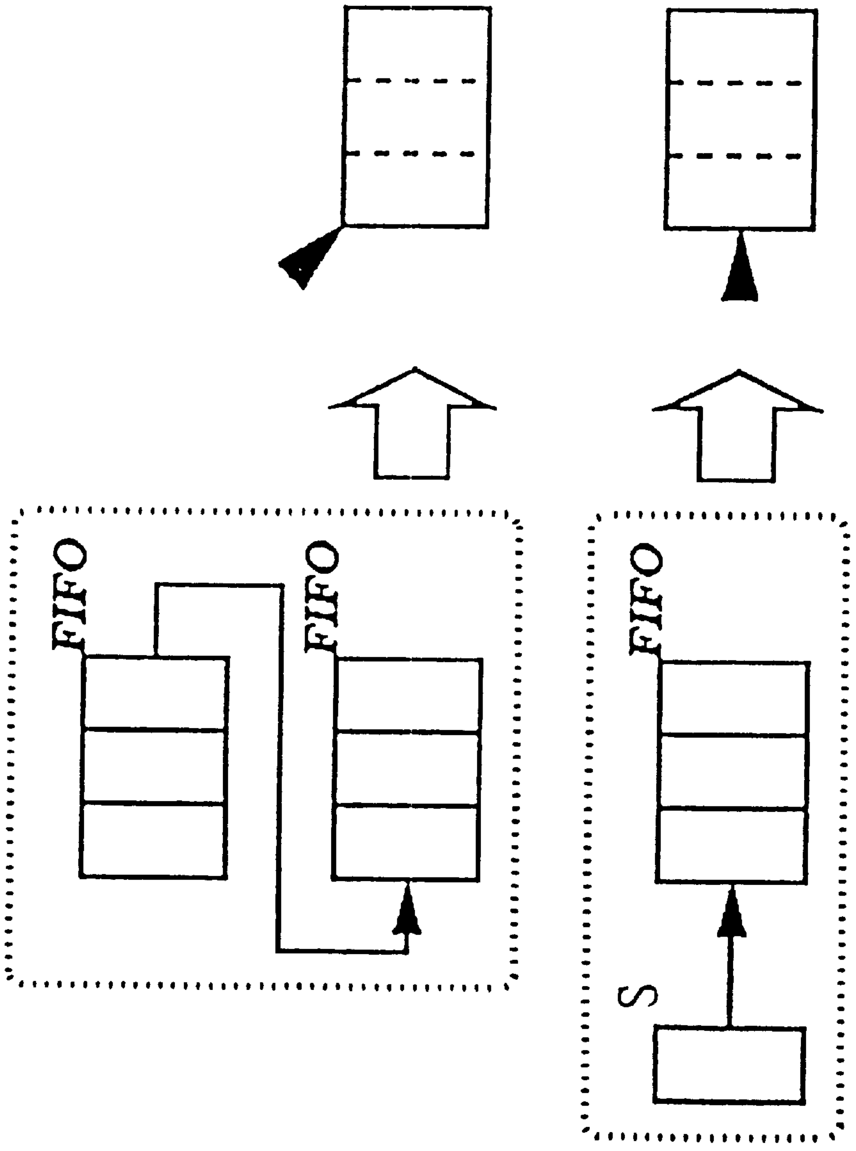
FIG. 5 illustrates the expressions of two different data flow for the FIFO register groups shown in FIG. 4.
Figure 6:
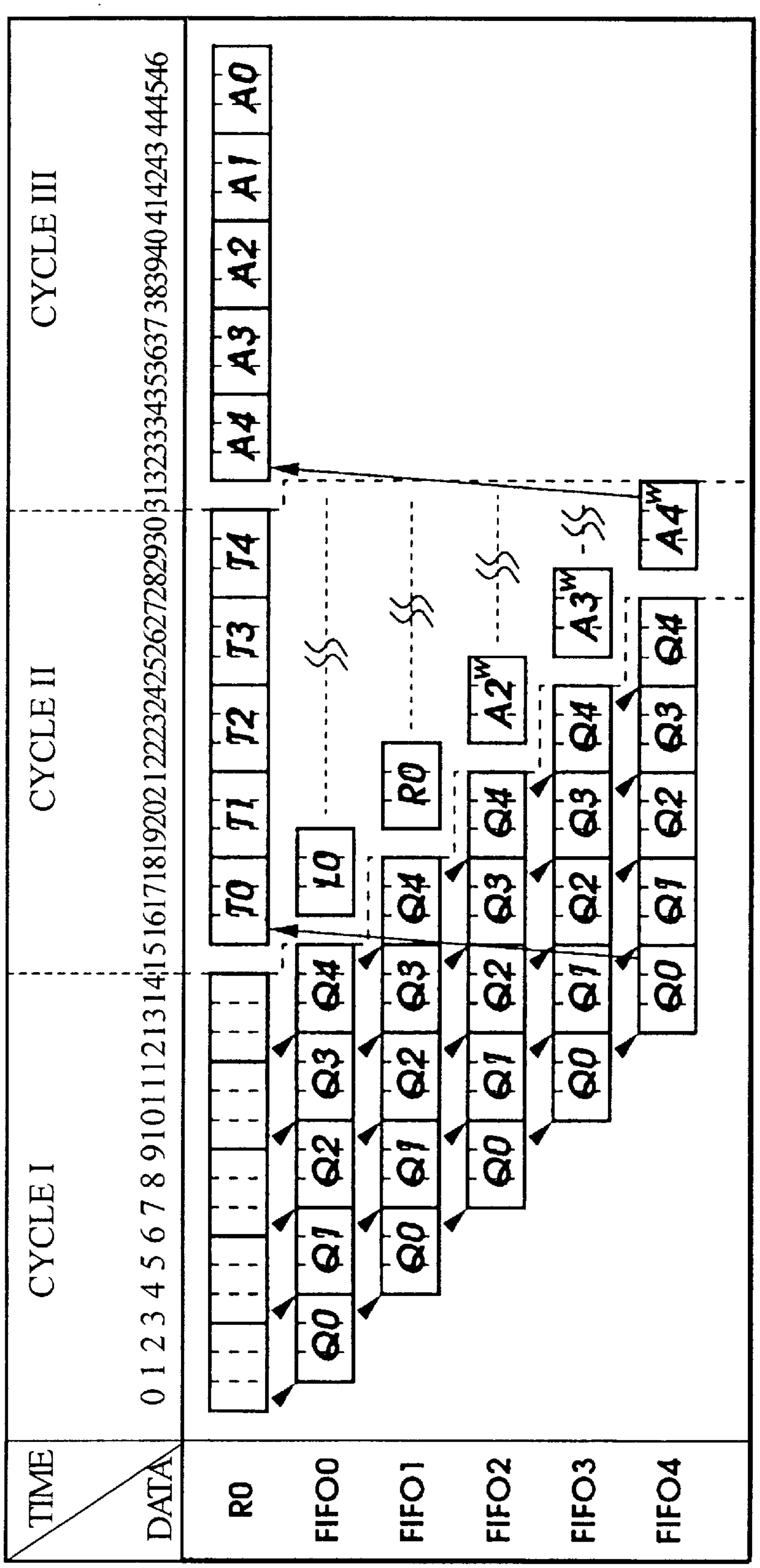
FIG. 6 is a graphical representation of the register allocation table for the overall IQ and MC decoding using the architecture shown in FIG. 4.
Figure 7:
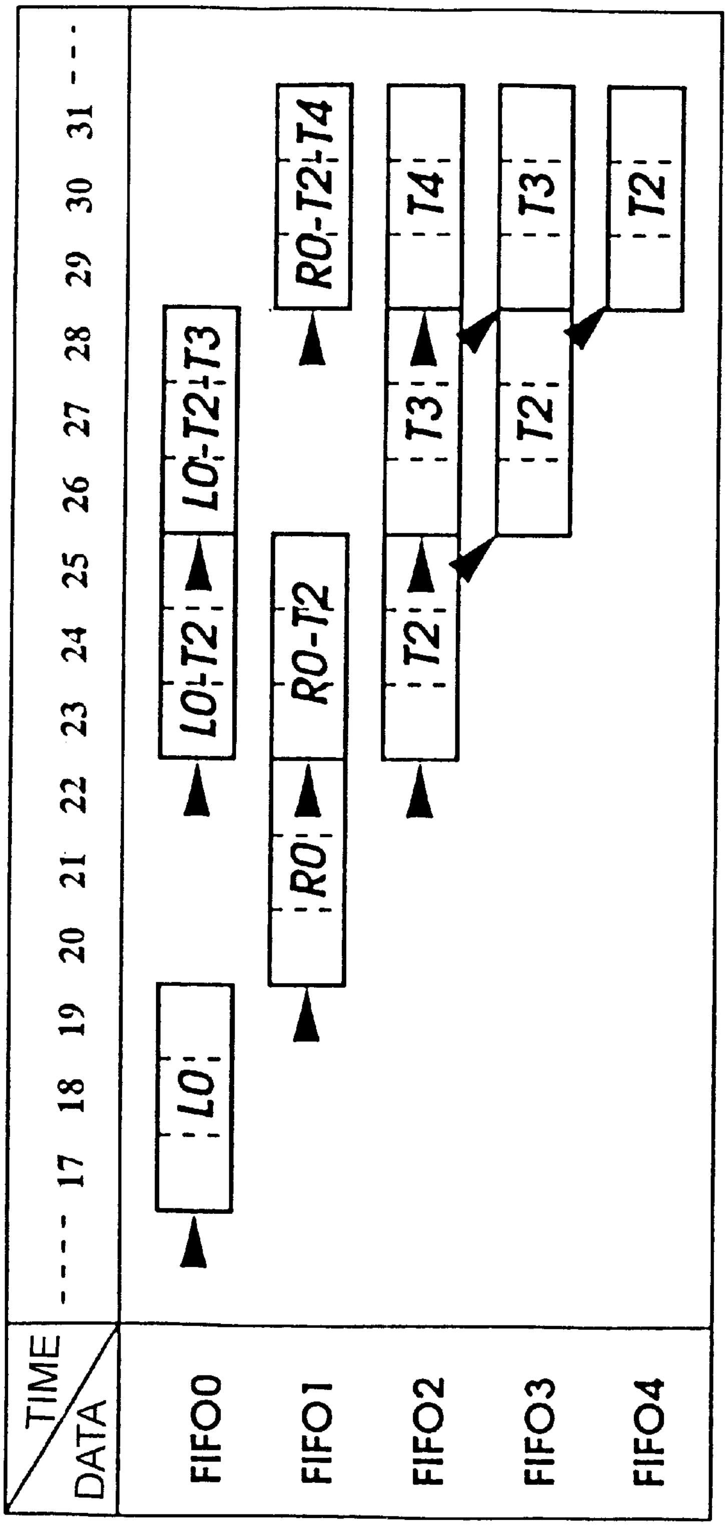
FIG. 7 is a graphical representation of the register allocation table for the flexible data allocation for dematrixing mode using the architecture shown in FIG. 4.

As shown in FIG. 4, FIFO1 and FIFO2 have two different sources of data. For ease of description, two different types of data flow for FIFO registers are defined in FIG. 5. Referring to FIG. 5, the relationship between the data stored in the registers (including the single register S and all the FIFO registers) and time (clock number) can be shown in FIG. 6. During Cycle I (Table 1) the data flow is in a first-in-first-out sequence, and a sample fed to the single register S is pipelined in the all the FIFO registers. For examples, a sample stored in the single register S at clock No. 0 will be shifted to the first FIFO register of the FIFO0 group at clock No. 1, and will be shifted from the third FIFO register of the FIFO0 group to the first FIFO register of the FIFO1 group at clock No. 4, and so on, until clock No. 16 the sample will be fed to the multiplier MPY from the last FIFO register of the FIFO4 group to start the Cycle II operations. The calculated value of the multiplier MPY is stored in the single register S at clock No. 16. During Cycle I the proposed architecture shown in FIG. 4 is utilized solely to compute $Q_x$ for all five channels. Once Cycle I is finished, the proposed architecture shown in FIG. 4 is configured to perform the Cycle II task, followed by the Cycle III task. During Cycle II, taking the factor in Table 2, tc_allocation, equal to 3 as an example, the calculated value of the multiplier MPY is fed to the single register S at clock Nos. 17–19 while the calculated value stored in the single register S at the preceding clock number is outputting to the first ADD/SUB 10 for arithmetic calculations and the result thereof is stored in the first FIFO register of the FIFO0, as shown in FIG. 7. At clock Nos. 20–22, the calculated value of the multiplier MPY is still fed to the single register S; however, the calculated value stored in the single register S at the preceding clock number is outputting to the second ADD/SUB 20 and the result thereof is stored in the first FIFO register of the FIFO1. At clock Nos. 23–25, the calculated value stored in the single register S at the preceding clock number is parallel outputting to the first and second ADD/SUB 10, 20 and the first FIFO register of the FIFO2 group, wherein the results of the first and second ADD/SUB 10, 20 are stored in the first FIFO register of the FIFO0 and FIFO1 groups respectively. During clock Nos. 23–25, the result stored in the first FIFO register of the FIFO0 group is its feedback (L0) subtracting the rescaled sample (T2), and the result stored in the first FIFO register of the FIFO1 group is its feedback (R0) subtracting the rescaled sample (T2). The samples stored in the FIFO0 to FIFO4 groups at clock Nos. 16 to 31 can be found in FIG. 7. Cycle II performs a flexible data allocation for the various dematrixing modes in DeM, whereby a fixed throughput is achieved. At clock No. 32, the Cycle III task is performed as shown in FIG. 6, wherein the weight sample stored in the FIFO4 group registers is feedback to the multiplier MPY, and the resulting calculation value is stored in the single register S, and will be output to a synthesis subband buffer such as IMDCT buffer at the next clock number.

The comparisons between the proposed architecture shown in FIG. 4 and the programmable-based DSP are shown in Table 3. Although some high performance DSP structures, such as VLIW and SIMD, can perform the decoding, they also have the disadvantages of a complex circuit design and no optimization in multichannel decoding. In addition to the advantages of a no-program ROM support and low cost design approach, the proposed architecture shown in FIG. 4 achieves a good synchronization with a fixed throughput, which is difficult to be realized in other processors based on straightforward implementation in MC processing. In addition to regularity and modularity, the processor core shown in FIG. 4 has a small area based on the applied technology.

TABLE 3

| Architecture | The present invention | Programmable DSP |
|---|---|---|
| Program ROM | No | Yes |
| Clcok number/granule* | 47 | 77~81 |
| Throughput (granule/cycles) | 1/47 | 1/77~1/81 |
| Number of data accesses | 25 | 53 |
| Pipelined | Yes | no |

*A granule is defined as 15 samples in Layer II.

A suitable controller (not shown in the drawings) for use in the architecture of the present invention can be implemented with a counter which generates clock numbers in response to said inverse quantization and multichannel processing in MPEG-2 audio decoding. Said controller is adapted to receive the factor of transmission mode, tc_allocation in Table 2, and generates control signals by using the clock numbers and said factor of transmission mode. Said control signals are fed to said multiplier MPY, said first and second ADD/SUB 10, 20, said single register S, and FIFO0–FIFO4 groups of FIFO registers, so that they can perform predetermined tasks according to said clock numbers, for examples those described herein with reference to FIGS. 4–7. The IQ and MC in MPEG-2 audio decoding to be performed by the proposed architecture shown in FIG. 4 are described with Verilog language as follows:

```
counter6 CNT6(.out(cntval), .reset(reset), .clk(clk));
assign lrmix = (tc__allocation == 1 o
                        tc__allocation == 2 o
                        tc__allocation == 6 o
                        tc__allocation == 7 );
assign lrrmix = (tc__allocation == 2 o
                        tc__allocation == 6);
assign lrlmix = (tc__allocation == 1 o
                        tc__allocation == 7);
// first level base = 0
assign ctrl__c__sf__deN = cntval < 16 ? 0:      // 0 => C
                        cntval < 48 ? 1:      // 1 => SF
                           2;       // 2 => deN
assign ctrl__s__s      =cntval < 16 ? 0:      // 0 => deG
                           1;       // 1 => s'(feedback value)
assign ctrl__mul       = cntval < 32 ? 0:      // 0 => multiplier output
                           1;       // 1 => s'(feedback)
// second level base = 1
assign ctrl0__0      = cntval < 33 ? 0:      // 0 => value from input
                        cntval < 36 ? 0:      // Lo
                        cntval < 39 ? 0:      // Ro
                        cntval < 42 ? 0:      // T2
                        cntval < 45
                        && lrmix ? 0:         // T3
                        cntval < 45 ? 1:      // zero
                        cntval < 48 ? 0:      // T4
                           0;
assign ctrl0__1      = cntval < 17 ? 0:      // 0 => CD
                        cntval < 33 ? 1:      // 1 => zero
                        cntval < 36 ? 1:
                        cntval < 39
                        && lrmix    ? 2:      // 2 => feedback selected
                        cntval < 39 ? 1:      // 1 => zero
                        cntval < 42 ? 2:      // 2 => feedback selected
                        cntval < 45 ? 2:      // 2 => feedback selected
                        cntval < 48 ? 2:      // 2 => feedback selected
                           2;
assign ctrl__as0      = cntval < 33 ? 0:      // 0 => ADD
                        cntval < 36 ? 0:
                        cntval < 39
                        && lrlmix    ? 1:     // Ro − Lo, or Ro
                        cntval < 39 ? 2:      // Lo − Ro
                        cntval < 42 ? 2:      // PRE − T2
                        cntval < 45
                        && lrlmix    ? 0:     // PRE + CURRENT
                        cntval < 45 ? 2:      // PRE − CURRENT
                        cntval < 48 ? 2:      // PRE − CURRENT
                           2;
// third level base = 4
assign ctrl1__0      = cntval < 39 ? 0:      // 0 => value from input
                        cntval < 42 ? 0:      // T2
                        cntval < 45
                        && lrrmix    ? 1:     // zero
                        cntval < 45 ? 0:      // T3
                        cntval < 48
                        && lrrmix    ? 0:     // T4
                        cntval < 48 ? 1:      // zero
                           1;
assign ctrl1__1      = cntval < 39 ? 0:      // 0 => zero
                        cntval < 42 ? 1:      // 1 => feedback selected
                        cntval < 45 ? 1:      // 1 => feedback selected
                        cntval < 48 ? 1:      // 1 => feedback selected
                           1;
assign ctrl1       = cntval < 36 ? 0:      // 0 => select from upper
                        cntval < 39
                        &&lrrmix    ? 1:      // 1 => select Ro
                        cntval < 39 ? 0:      // 0 => select Lo
```

-continued

```
                        cntval < 42 ? 1:      // 1 => select T2
                        cntval < 45 ? 1:      // 1 => select T3
                        cntval < 48 ? 1:      // 1 => select T4
                           0;      // 0 => select from upper
assign ctrl__as1      = cntval < 36 ? 0:      // 0 => ADD
                        cntval < 39 ? 0:
                        cntval < 42 ? 2:      // PRE − T2
                        cntval < 45 ? 2:      // PRE − CURRENT
                        cntval < 48 ? 2:      // PRE − CURRENT
                           2;
// forth level base = 7
assign ctrl2       = cntval <39 ? 0:      // 0 => upper value
                  cntval <48 ? 1:      // 1 => feedback selected
                           0;      // 0 => upper value
```

What is claimed is:

1. A structure for inverse quantization and multichannel processing in MPEG-2 audio decoding comprising:

M groups of first-in-first-out (abbreviated as FIFO) registers, wherein M is an integer equal to or greater than 5, each group of which has a plurality of FIFO registers and has the same number of FIFO registers, wherein all the FIFO registers are connected in series, so that samples fed to a first FIFO register thereof in the course of clock can be stored one-by-one and shifted in the FIFO registers according to a first-in-first-out rule;

a multiplier having two input terminals, one of which is adapted to receive a first factor from a first factor table, and another of which is capable for receiving an internal data processing feedback from a last FIFO register of said M groups of FIFO registers and is adapted to receive an external audio sample;

a single register storing a calculated value of said multiplier;

a first adder/subtractor having two input terminals and one output terminal, wherein one of said two input terminals is connected to said single register for receiving said calculated value stored therein, another one of said two input terminals is for receiving a feedback from a last FIFO register of a first group of FIFO registers of said M groups of FIFO registers and a second factor of a second factor table, and said output terminal thereof is connected to a first FIFO register of the first group of FIFO registers, so that an output of said first adder/subtractor is fed and stored in the first FIFO register of the first group of FIFO registers;

a second adder/subtractor having two input terminals and one output terminal, wherein one of said two input terminals is connected to said single register for receiving the calculated value stored therein, and another one of said two input terminals is for receiving a feedback from a last FIFO register of a second group of FIFO registers of said M groups of FIFO registers; wherein a first FIFO register of said second group of FIFO registers stores an output from said output terminal of said second adder/subtractor or an output from said last FIFO register of said first group of FIFO registers; a first FIFO register of a third group of FIFO registers of said M groups of FIFO registers stores the calculated value stored in said single register or an output from said last FIFO register of said second group of FIFO registers; a first FIFO register of a fourth group of FIFO registers of said M groups of FIFO registers stores an output from a last FIFO register of said third group of FIFO registers, and so on, until an output from the last FIFO register of said M groups of FIFO registers is returned to said multiplier as said internal data processing feedback; and said single register stores said calculated value of said multiplier at a clock number n, wherein n is an integer greater than 0, and output said calculated value of said multiplier to an outside buffer as an output of said structure or to at least one of said first adder/subtractor, second adder/subtractor and said first FIFO register of said third group of FIFO registers at a clock number of n+1.

2. The structure according to claim 1, wherein M is set to equal to 5 for five audio channels.

3. The structure to claim 2, wherein each group of s aid M groups of FIFO registers has three FIFO registers for use in MPEG-2, Layer II audio decoding.

4. The structure according to claim 1 further comprising means for generating control signals having a counter which generates clock numbers in response to said inverse quantization and multichannel processing in MPEG-2 audio decoding, said means being adapted to receive a factor of transmission mode, wherein said control signals are generated by using the clock numbers and said factor of transmission mode, and are fed to said multiplier, said first and second adder/subtractors, said single register, and said M groups of FIFO registers, so that said multiplier, said first and second adder/subtractors, said single register, and said M groups of FIFO registers can perform predetermined tasks according to said clock numbers.

* * * * *